United States Patent [19]

Breton et al.

[11] 4,369,525

[45] Jan. 18, 1983

[54] DEVICE FOR AUTOMATIC REGULATION OF THE OUTPUT POWER OF A TRANSMITTER MODULE IN AN OPTICAL-FIBER TRANSMISSION SYSTEM

[75] Inventors: Jean P. Breton; Adalbert Maciaszek, both of Paris, France

[73] Assignee: Lignes Telegraphiques et Telephoniques, Conflans Ste. Honorine, France

[21] Appl. No.: 236,629

[22] Filed: Feb. 20, 1981

[30] Foreign Application Priority Data

Feb. 22, 1980 [FR] France .......................... 80 03983

[51] Int. Cl.³ .............................................. H04B 9/00
[52] U.S. Cl. ...................................... 455/618; 372/29; 372/30; 372/31; 372/33
[58] Field of Search ................ 455/610, 613, 618; 372/29, 30, 31, 33

[56] References Cited

U.S. PATENT DOCUMENTS

| | | | |
|---|---|---|---|
| 4,149,071 | 4/1979 | Nagai | 455/618 |
| 4,181,901 | 1/1980 | Heyke | 372/31 |
| 4,243,952 | 1/1981 | Patterson | 372/29 |
| 4,307,469 | 12/1981 | Casper | 455/618 |
| 4,338,577 | 7/1982 | Sato | 372/29 |

FOREIGN PATENT DOCUMENTS

| | | | |
|---|---|---|---|
| 2737345 | 3/1978 | Fed. Rep. of Germany. | |
| 2813513 | 10/1978 | Fed. Rep. of Germany | 372/31 |
| 2923683 | 1/1980 | Fed. Rep. of Germany. | |
| 2847182 | 5/1980 | Fed. Rep. of Germany | 372/29 |
| 54-142987 | 11/1979 | Japan | 372/33 |
| 55-63895 | 5/1980 | Japan | 372/29 |

OTHER PUBLICATIONS

*IBM Technical Disclosure Bulletin*, vol. 22, No. 3, Aug. 1979, Brown, J. O. "Injection Laser Biasing Circuit Using Temperature Dependent Resistors".

*Primary Examiner*—Howard Britton
*Attorney, Agent, or Firm*—Cushman, Darby & Cushman

[57] ABSTRACT

A device for automatically regulating the output power of a transmitter module in an optical-fiber transmission system comprises a first circuit connected between a temperature sensor and the laser diode in order to regulate the direct current of the laser diode, and a second circuit connected between a photodiode and the laser diode in order to regulate the laser-diode modulation current.

5 Claims, 1 Drawing Figure

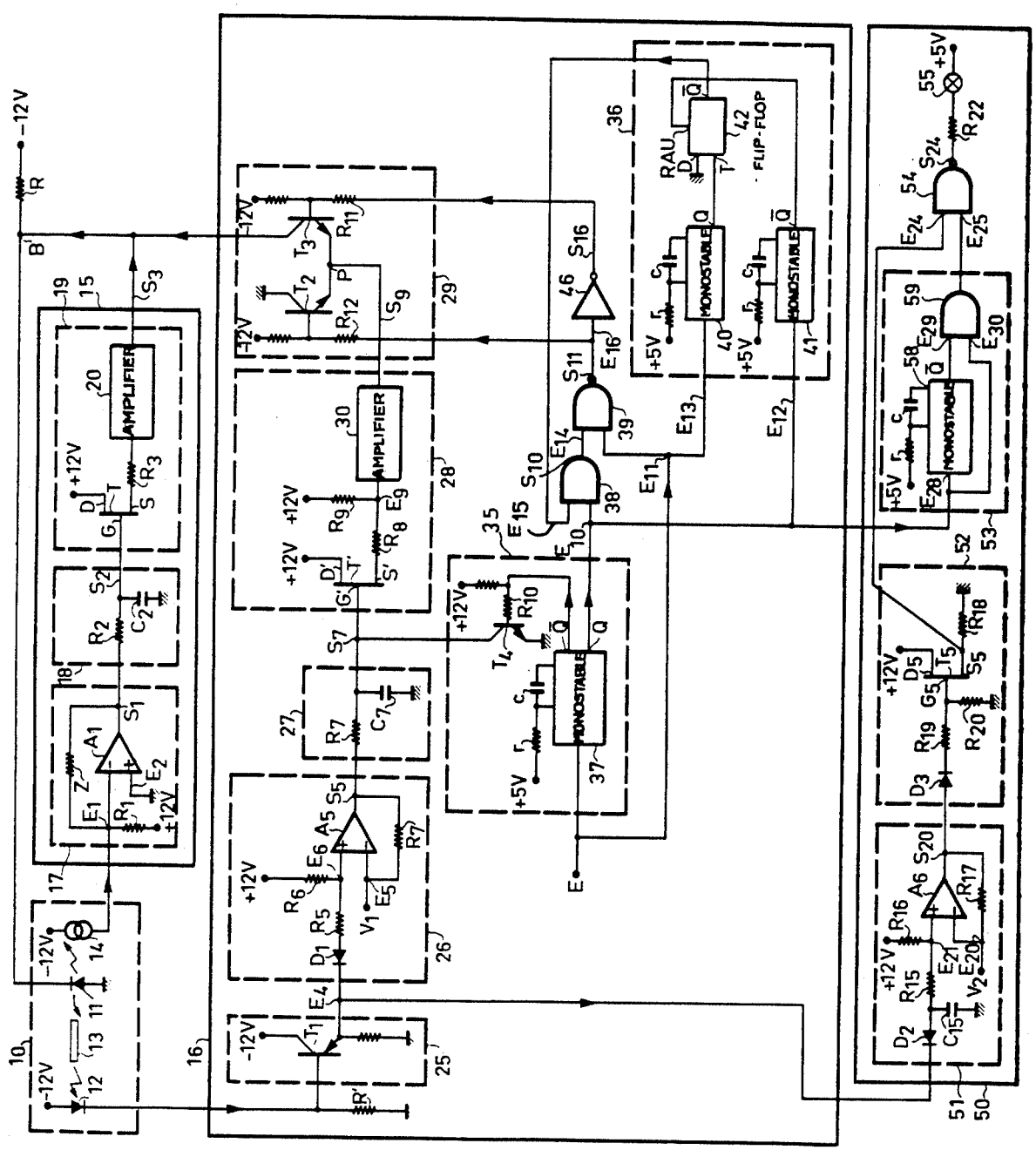

DEVICE FOR AUTOMATIC REGULATION OF THE OUTPUT POWER OF A TRANSMITTER MODULE IN AN OPTICAL-FIBER TRANSMISSION SYSTEM

This invention relates generally to optical-fiber transmission systems and more particularly to a device for automatic regulation of the output power of the transmitter module in a simplified transmission system for a single-fiber optical communications link.

An optical-fiber transmission system is constituted by a transmitter module, a receiver module and a fiber extending between these modules. The transmitter module comprises a light-emitting base constituted by a laser diode, by a control photodiode and a laser/fiber optical coupling system inserted in a connector plug for connecting said transmitter base to the optical-fiber cable, and an electronic control unit which is intended among other design functions to regulate the optical transmission power. The receiver module comprises a light-detecting base constituted by a photodetector such as an avalanche photodiode and by a photodiode/fiber optical coupling system inserted in a connector plug for connecting said base to the optical-fiber cable, and an electronic control unit which has the intended function, among others, of automatically regulating the gain of the avalanche photodiode. For a detailed description of the transmitter module, reference may usefully be made for example to the article published in "The Bell System Technical Journal", volume 57, No 6, July-August 1978, page 1823, entitled "GaAlAs Laser Transmitter for Light-wave Transmission Systems".

In an optical fiber transmission system, it is known that the current of the laser diode employed in the transmitter module in the presence of digital data to be transmitted results from superposition of its d.c. bias current and its modulation current; the light pulses are thus transmitted within the fiber at the nominal optical power of the laser diode.

The aim of the present invention is on the one hand to provide automatic regulation of the nominal optical power emitted by the laser diode by carrying out simultaneously a regulation of the direct-current and a regulation of the laser diode modulation current and, on the other hand, to warn the user in the event of faulty operation of a circuit of the transmitter module and especially in the event of aging of the laser diode, and also to suppress the modulation current within the laser diode if the frequency of data to be transmitted has a high value.

To this end, the invention is directed to a device for automatically regulating output power in a transmitter module of a transmission system which utilizes an optical fiber and comprising:

a unit in which are arranged a laser diode, means for extracting the optical power emitted by the laser diode and converting said optical power to electric power, and a sensor which is responsive to the temperature of the unit;

a first circuit connected between the temperature sensor and the laser diode for regulating the direct current of said laser diode and comprising at least a first generator for producing a current which is variable as a function of the temperature of the unit and has a long time constant with respect to the transmission rate;

a second circuit connected between the converting means and the laser diode for regulating the modulation current of said laser diode and comprising at least a second generator for producing a variable current as a function of the power of the laser diode, and means forming a switch controlled by the data to be transmitted and connected in series between said second current generator and said laser diode.

In accordance with another distinctive feature of the invention, the automatic power-regulating device is further provided with a threshold alarm-triggering circuit connected in parallel to the output of the converting means and comprising delay means connected between the second output terminal of a circuit for controlling the second current generator and one of the input terminals of a logical gate, the other input terminal of said gate being connected to the output of voltage-comparing means whose input is connected to the output of the converting means, and the output terminal of said gate being connected to an alarm device.

These and other features of the invention will be more apparent upon consideration of the following description and of the accompanying drawing FIGURE which is given solely by way of example. The single FIGURE is given partly in the form of a schematic circuit diagram of the transmitter module comprising the automatic power-regulating device in accordance with the invention.

In one example of construction, the transmitter module of a transmission system which makes use of a single optical fiber comprises a unit 10 designed in the form of a box in which are mounted a laser diode 11, the optical emission power of which is injected into the fiber (not shown in the FIGURE), means whereby part of the optical power emitted by the laser diode is extracted and converted to electric power and consisting, for example, of a photodiode 12 supplied with current at $-12$ volts, a coupling fiber 13 between the laser diode and the photodiode 12, and a probe or sensor which is responsive to the temperature of the box 10 and is designed in the form of a current generator 14 supplied with current at $-12$ volts. In addition, the resistor for biasing the laser diode 11 is shown at R; said resistor has a predetermined fixed value and is connected in series between the laser diode and a supply voltage of $-12$ volts.

In accordance with the invention, the device for automatically regulating the output power of the laser diode 11 within the transmitter module comprises a first circuit 15 for regulating the d.c. bias current of the laser diode and connected between the temperature sensor 14 and the laser diode 11, and a second circuit 16 for regulating the modulation current of the laser diode and connected between the photodiode 12 and the laser diode 11.

As is clearly apparent from the FIGURE, the first circuit 15 for regulating the d.c. bias current of the laser diode 11 comprises in series a current-voltage converter 17, a low-pass filter 18 and a generator 19 for producing a current which is variable as a function of the temperature of the box 10 and which has a long time constant with respect to the transmission rate.

In more precise terms, the current-voltage converter 17 is constituted by an operational amplifier $A_1$ mounted as a transimpedance, one input $E_1$ of which is connected to the temperature sensor 14 and the other input $E_2$ of which is connected to ground. Furthermore, there is shown at Z the negative feedback impedance connected between the output $S_1$ an the input $E_1$ of the operational amplifier $A_1$, a resistor $R_1$ being connected between the input $E_1$ and a supply voltage of +12 volts. The operational amplifier $A_1$ delivers at the output $S_1$ a voltage which is a function of the input voltage produced by the current generator 14.

Moreover, the low-pass filter 18 consists of a single cell $R_2$, $C_2$, the resistor $R_2$ being connected to the output $S_1$ of the operational amplifier $A_1$ and the capacitor $C_2$ being connected to ground. Finally, the current generator 19 consists of a field-effect transistor T, the gate G of which is connected to the output $S_2$ of the low-pass filter 18, the drain D of which is connected to a supply voltage of +12 volts and the source S of which is connected through a resistor $R_3$ to a current amplifier 20 of conventional structure. The output $S_3$ of the current amplifier 20 is connected at B to the laser diode 11, that is to say in parallel with the bias resistor R.

Furthermore, the second modulation current regulating circuit 16 comprises in series an impedance matching circuit 25, a voltage comparator circuit 26, a low-pass filter 27, a generator 28 for producing a current which is variable as a function of the power of the laser diode 11, and a circuit forming a switch 29 of the chopper type controlled by the digital data to be transmitted. The negative feedback resistor of the photodiode 12 is shown at R'.

More specifically, the impedance-matching circuit 25 is constituted by a transistor $T_1$ mounted as an emitter-follower, the collector of said transistor being connected to a supply of −12 volts. The voltage comparator circuit 26, the input $E_4$ of which is connected to the emitter of the transistor $T_1$ comprises an operational amplifier $A_5$, one input $E_5$ of which is connected to a reference voltage source $V_1$ corresponding to the nominal optical power emitted by the laser diode 11. Furthermore, a diode $D_1$, the cathode of which is connected to the emitter of the transistor $T_1$, and a resistor $R_5$, are connected in series between the terminal $E_4$ and the other input $E_6$ of the operational amplifier $A_5$. A resistor $R_6$ is connected between the input $E_6$ of the amplifier $A_5$ and a supply of +12 volts, and a negative feedback resistor $R_7$ is connected between the output $S_5$ and the input $E_5$ of the amplifier $A_5$.

Moreover, the low-pass filter 27 consists of a single cell $R_7$, $C_7$, the resistor $R_7$ being connected to the output $S_5$ of the operational amplifier $A_5$ and the capacitor $C_7$ being connected to ground.

The current generator 28 consists of a fieldeffect transistor T', the gate G' of which is connected to the output $S_7$ of the low-pass filter 27, the drain D' of which is connected to a supply of +12 volts and the source S' of which is connected through a resistor $R_8$ to the input $E_9$ of a current amplifier 30 of conventional structure. There is shown at $R_9$ a resistor connected between the input $E_9$ of the current amplifier 30 and a supply of +12 volts.

Furthermore, the circuit 29 of the chopper type consists of two transistors $T_2$ and $T_3$ supplied at −12 volts with their respective emitters connected to each other, the output $S_9$ of the current amplifier 30 being connected to a common terminal P of the emitters. Moreover, the collector of the transistor $T_2$ is connected directly to ground whilst the collector of the transistor $T_3$ is connected to the laser diode 11 at B. As will be explained hereinafter, the two transistors $T_2$ and $T_3$ operate alternately and at a low level. Advantageously, said chopper circuit 29 can be designed in the form of a hybrid circuit, thus appreciably reducing the construction cost of this circuit.

The circuit 16 for regulating the modulation current of the laser diode also comprises a circuit 35 for controlling the current generator 28 and a limiting circuit 36 which is responsive to the frequency of data to be transmitted.

More precisely, the circuit 35 for controlling the current generator 28 comprises a monostable device 37 supplied at +5 volts (in which there are shown the resistor r and the capacitor c, thus defining the time during which the monostable device is in its stable state); said device has two complementary outputs Q and $\overline{Q}$ and an input terminal E for the digital data to be transmitted. The output $\overline{Q}$ of the monostable device 37 is connected through a resistor $R_{10}$ to the base of a transistor $T_4$ which is supplied at +12 volts and mounted with a common-emitter connection, the collector of the transistor $T_4$ being connected to the output $S_7$ of the low-pass filter 27. Furthermore, the output Q of the monostable device 37 is connected to one of the input terminals $E_{10}$ of a logical AND-gate 38 whilst the input E of the monostable device 37 is connected to one of the input terminals $E_{11}$ of a logical NAND-gate 39.

The limiting circuit 36 which is responsive to the frequency of data to be transmitted consists of a first monostable device 40 (with its resistor r and its capacitor c), a second monostable device 41 whose input $E_{12}$ is connected in parallel with the input $E_{10}$ of the AND-gate 38, and a bistable circuit 42 having one input for data D which is connected to ground, a clock input T connected to the output Q of the monostable device 40 and a "reset-to-one" (RAU) input connected to the output $\overline{Q}$ of the monostable circuit 41. The input $E_{13}$ of the monostable device 40 is connected in parallel with the input $E_{11}$ of the logical NAND-gate 39, the other input terminal $E_{14}$ of said logical gate 39 being connected to the output terminal $S_{10}$ of the logical AND-gate 38.

The output $\overline{Q}$ of the bistable circuit 42 is connected to the other input terminal $E_{15}$ of the logical AND-gate 38 whilst the output terminal $S_{11}$ of the logical NAND-gate 39 is connected to the input $E_{16}$ of an inverter 46, the output $S_{16}$ of which is connected through a resistor $R_{11}$ to the base of the transistor $T_3$. Furthermore, the base of the transistor $T_2$ is connected through a resistor $R_{12}$ to the output $S_{11}$ of the logical NAND-gate 39. The logical NAND-gate 39 and the inverter 46 therefore constitute a control circuit for the switching means 29.

In accordance with the invention, the transmitter module of the optical-fiber transmission system which has just been described is provided in addition with a threshold alarm-triggering circuit 50 for warning the user mainly in the event of aging of the laser diode 11.

As is readily apparent from the figure, said alarm-triggering circuit 50 comprises a voltage comparator circuit 51, a circuit 52 for shaping the signal generated by the comparator circuit 51, a delay circuit 53, a logical NAND-gate 54, and an alarm device such as a warning indicator lamp 5, for example.

More specifically, the voltage comparator circuit 51 consists of an operational amplifier $A_6$, one input $E_{20}$ of which is connected to a reference voltage source $V_2$. In addition, a diode $D_2$ and an integrating circuit comprising a capacitor $C_{15}$ and a resistor $R_{15}$ are connected in series between the input terminal $E_4$ of the voltage comparator circuit 26 and the other input $E_{21}$ of the operational amplifier $A_6$. A resistor $R_{16}$ is connected between the input $E_{21}$ of the amplifier $A_6$ and a supply of +12 volts, and a negative feedback resistor $R_{17}$ is connected between the output $S_{20}$ and the input $E_{20}$ of the amplifier $A_6$.

The signal-shaping circuit 52 consists of a field-effect transistor $T_5$, the drain $D_5$ of which is connected to a supply of +12 volts, the source $S_5$ of which is connected to a resistor $R_{18}$ connected to ground and the gate $G_5$ of which is connected to a network comprising a diode $D_3$ connected to the output $S_{20}$ of the amplifier $A_6$, a resistor $R_{19}$ in series, and a resistor $R_{20}$ connected to ground.

The logical NAND-gate 54 has a first input terminal $E_{24}$ connected to the source $S_5$ of the field-effect transistor $T_5$, a second input terminal $E_{25}$ connected to the output of the delay circuit 53, and an output terminal $S_{24}$ to which are connected in series a resistor $R_{22}$ and the warning indicator lamp 55 which is supplied at +5 volts.

In addition, the delay circuit 53 comprises a monostable device 58 (with its resistor r and its capacitor c), the input $E_{28}$ of which is connected to the input terminal $E_{10}$ of the logical AND-gate 38 and the output $\overline{Q}$ of which is connected to a first input terminal $E_{29}$ of a logical AND-gate 59. The other input terminal $E_{30}$ of said logical AND-gate 59 is connected to the input $E_{28}$ of the monostable device 58.

The operation of the device for automatic power regulation of the laser diode and of the alarm-triggering circuit in accordance with the invention which have been described in the foregoing will now be explained hereinafter.

It will first be recalled that, in the presence of digital data to be transmitted, the current of the laser diode 11 results from superposition of its bias current and of its modulation current, with the result that the amplitude of the light pulses transmitted in the optical fiber depends on the optical power emitted by the laser diode. Since it is desired to transmit the light pulses at the maximum output power of the laser diode, it proves necessary to stabilize said maximum optical power; this stabilization is obtained by regulating the laser-diode modulation current. Furthermore, when the temperature of the box containing the laser diode varies, the transfer characteristic of the laser diode (output power as a function of current) is modified, with the result that regulation of the direct-current of the laser diode as a function of temperature permits detection in respect of aging of the laser diode which is identical throughout the range of utilization temperatures.

With reference to the figure, regulation of the direct current of the laser diode as a function of the temperature of the box containing the laser diode will now be explained.

When the box temperature varies, the steady current generated by the bias resistor R of the laser diode 11 may no longer be sufficient to permit suitable biasing of the laser diode by reason of the fact that the transfer characteristic of the diode changes as a function of temperature. Under these conditions, the bias current to be employed is obtained by adding to the current in the resistor R a temperature-dependent regulating d.c. current produced by the regulating circuit 15 in the following manner.

At the time of a variation in temperature of the box, the current generator 14 delivers a temperature-dependent current which is converted to voltage by the amplifier 17 mounted as a transimpedance. After passing through the low-pass filter 18, the output signal is then applied to the current generator 19 which delivers a d.c. regulating current at its output $S_3$. Thus the sum of the current within the resistor R and of the regulating current obtained produces the desired bias current for the laser diode 11.

Regulation of the laser-diode modulation current which is intended to stabilize the nominal optical power emitted by the laser diode is carried out in the following manner.

The electrical signal generated by the photodiode 12, the current of which is a function of the optical power emitted by the laser diode 11, appears at the terminals of the negative feedback resistor R'. After passing through the impedance-matching circuit 25, the signal is rectified by the diode $D_1$, whereupon its level is compared by the amplifier $A_5$ with a reference level $V_1$ corresponding to the nominal output power of the laser diode 11. The signal delivered at the output $S_5$ of the amplifier $A_5$ is first passed through the low-pass filter 27 and then applied to the variable current generator 28 which is controlled by the circuit 35.

It will be postulated that the input E of the modulation-current control circuit 35 does not receive any digital information to be transmitted and that a so-called positive logic is employed or, in other words, that a level "0" corresponds to a zero voltage and that a level "1" corresponds to a positive or a negative voltage. In this case of absence of information, the outputs Q and $\overline{Q}$ of the monostable device 37 are respectively at the levels "0" and "1". Thus the transistor $T_4$ is saturated and the voltage at the output $S_7$ of the low-pass filter 27 is zero. Accordingly, the current within the resistor $R_8$ is zero and the current which appears at the input of the current amplifier 30 corresponds to the current within the resistor $R_9$. Furthermore, since the output Q of the monostable device 37 is at the level "0", the output $S_{10}$ of the logical AND-gate 38 is at the level "0", the output $S_{11}$ of the logical NAND-gate 39 is at the level "1" and the output $S_{16}$ of the inverter 46 is at the level "0". Under these conditions, the transistor $T_2$ is in the conducting state whilst the transistor $T_3$ is in the non-conducting state, with the result that no current is produced at the output of the chopper circuit 29.

It will now be postulated that the input E of the modulation-current control circuit 35 receives the digital data to be transmitted. In this case, the outputs Q and $\overline{Q}$ of the monostable device 37 are respectively at the levels "1" and "0". Thus the transistor $T_4$ is in the non-conducting state and the voltage at the output $S_7$ of the low-pass filter 27 varies according to the nominal power regulation to be ensured as determined at the output of the amplifier $A_5$. Accordingly, the current generator 28 delivers at its output $S_9$ a current which is intended to ensure regulation of the laser-diode modulation current. Furthermore, since the output Q of the monostable device 37 is at the level "1" and assuming that the input $E_{15}$ of the logical AND-gate 38 is also at the level "1" obtained at the output of the bistable circuit 42, the output $S_{10}$ of said AND-gate is at the level "1". Accordingly, since a level "1" is applied to the input $E_{14}$ of the logical NAND-gate 39 and the digital data to be transmitted are applied to the other input $E_{11}$ of said gate 39, the output $S_{11}$ of this latter delivers the same digital data but in phase opposition. Moreover, the digital data in phase opposition with respect to the data which are present at the output $S_{11}$ of the logical NAND-gate 39 are obtained at the output $S_{16}$ of the inverter 46. In this manner, the transistors $T_2$ and $T_3$ operate in alternate sequence, with the result that a regulation of the laser-diode modulation current is obtained at the output of the transistor $T_3$.

Moreover, the modulation current within the laser diode is suppressed when the frequency of the data to be transmitted is higher than a maximum predetermined frequency. This is carried out by means of the circuit 36 for frequency limitation of the digital data to be transmitted. Thus, when the frequency of the data to be transmitted is lower than the maximum predetermined value, the output Q of the monostable device 40 delivers pulses and the output $\overline{Q}$ of the bistable circuit 42 is at the level "1". Under these conditions, the output $S_{10}$ of the logical AND-gate 38 is at the level "1", with the result that regulation of the laser-diode modulation current can take place. Furthermore, when the frequency of the data to be transmitted is higher than the maximum value, the output Q of the monostable device 40 is at the level "1" and the output $\overline{Q}$ of the bistable circuit 42 is at the level "0" by reason of the "negative" pulse delivered by the output $\overline{Q}$ of the monostable device 41. Under these conditions, the output $S_{10}$ of the AND-gate 38 is at the level "0", the output $S_{11}$ of the logical NAND-gate 39 is at the level "1", the output $S_{16}$ of the inverter 46 is at the level "0", thereby producing a zero modulation current at the output of the chopper circuit 29. This accordingly forestalls any potential danger of damage to the laser diode. This would occur at high frequencies as a result of saturation of the matching circuit 25. In order to operate at higher frequencies, said matching circuit 25 is modified and the time constant given by the resistor r and the capacitor c which are associated with the monostable device 40 is changed.

The operation of the alarm-triggering device 50 in accordance with the invention will now be explained.

At the output $E_4$ of the impedance-matching circuit 25, the signal is rectified by the diode $D_2$, whereupon its level is compared by the amplifier $A_6$ with a reference level $V_2$ corresponding to a multiple k less than 1 of the nominal output power of the laser diode 11. The warning indicator lamp 55 will therefore light-up when the optical power emitted by the laser diode becomes lower than the reference optical power equal to k multiplied by the nominal power, thus warning the user of aging of the laser diode.

However, at the time of start-up of digital data transmission, the optical power emitted by the laser diode does not stabilize immediately at its nominal power, with the result that the indicator lamp 55 lights up. The delay circuit 53 provided in the alarm-triggering device has the precise function of preventing such an untimely alarm indication. In fact, at the time of data transmission start-up, the output Q of the monostable device 37 is at the level "1" and the input $E_{30}$ of the logical AND-gate 59 is also at the level "1". Moreover, the output Q of the monostable device 58 is at the level "0" during the time interval T=rc, with the result that the output of the logical AND-gate 59 is at a level "0" during the time interval T and is at a level "1" after the time interval T. In point of fact, at the moment of start-up of data transmission, there is a positive voltage of +5 volts (alarm level "1") at the output of the field-effect transistor $T_5$ during a time interval T' which is substantially equal to T/3 and corresponds to the time required for stabilization at the nominal power of the laser diode. Under these conditions, a level "1" or in other words a voltage of +5 volts is present at the output $S_{24}$ of the logical NAND-gate 54 during the time interval T. From that time onwards, no current passes through the resistor $R_{22}$, with the result that the warning indicator lamp 55 does not light up.

When stabilization at the nominal power of the laser diode has been achieved, the input $E_{25}$ of the NAND-gate 54 is at a level "1". When a positive voltage of +5 volts (alarm level "1") appears at the output of the field-effect transistor $T_5$ or, in other words, when the optical power emitted by the laser diode is lower than the reference optical power, the output $S_{24}$ of the logical NAND-gate 54 is at the level "0" corresponding to a zero voltage. The warning lamp 55 then lights up and consequantly warns the user that the laser diode needs to be replaced in the near future. On the other hand, if a zero voltage (alarm level "0") is present at the output of the field-effect transistor $T_5$ or, in other words, when the optical power emitted by the laser diode is higher than the reference optical power, the output $S_{24}$ of the logical NAND-gate 54 is at the level "1" corresponding to a voltage of +5 volts, with the result that the warning lamp 55 does not light up.

What is claimed is:

1. A device for automatically regulating output power in a transmitter module for a transmission system which utilizes an optical fiber and comprising:
    a unit in which are arranged a laser diode, means for extracting part of the optical power emitted by the laser diode and converting said optical power to electric power, and a sensor which is responsive to the temperature of the unit;
    a first circuit connected between said temperature sensor and said laser diode for regulating the direct current of said laser diode and comprising at least a first generator for producing a current which is variable as a function of the temperature of the unit and has a long time constant with respect to the transmission rate;
    a second circuit connected between said converting means and said laser diode for regulating the modulation current of said laser diode and comprising at least a second generator for producing a variable current as a function of the power of the laser diode, and means forming a switch controlled by the data to be transmitted and connected in series between said second current generator and said laser diode.

2. A device according to claim 1, wherein said first circuit for regulating the direct current of the laser diode further comprises in series:
    an operational amplifier mounted as a transimpedance whose input is connected to said temperature sensor;
    a first low-pass filter whose output is connected to said first current generator, the output of said first current generator being connected to the laser diode, and wherein said second circuit for regulating the modulation current of the laser diode further comprises in series:
    voltage comparator means, the input of which is connected to said converting means;
    a second low-pass filter, the output of which is connected to said second current generator.

3. A device according to claim 1 or claim 2, wherein said second circuit for regulating the modulation current of the laser diode further comprises:
    a first circuit for controlling said second current generator and having an input terminal for the data to be transmitted, a first output terminal connected to the input of said second current generator, and a second output terminal connected to the first input terminal of a logical AND-gate;

a limiting circuit responsive to the frequency of the data to be transmitted and having a first input terminal connected to the input terminal of said first control circuit, a second input terminal connected to the second output terminal of said first control circuit, and an output terminal connected to the second input terminal of said logical AND-gate;

a second logic circuit for controlling said means forming a switch and connected in series between the output terminal of said logical AND-gate and said switch-forming means, the input terminal of said first control circuit being connected to said second control logic circuit.

4. A device according to claim 3, wherein said limiting circuit which is responsive to the frequency comprises:

a first monostable device, the input of which is connected to the first input terminal of said limiting circuit;

a second monostable device, the input of which is connected to the second input terminal of said limiting circuit;

a bistable circuit connected between the respective outputs of said first and second monostable devices and having an output terminal connected to the second input terminal of said logical AND-gate.

5. A device according to claim 1, wherein said device further comprises a threshold alarm-triggering circuit connected in parallel with the output of said converting means and comprising delay means connected between the second output terminal of said first control circuit of the second current generator and one of the input terminals of a logical gate, the other input terminal of said gate being connected to the output of a voltage comparator means whose input is connected to the output of said converting means, and the output terminal of said gate being connected to an alarm device.

* * * * *